United States Patent [19]

Dance

[11] Patent Number: 5,168,216

[45] Date of Patent: Dec. 1, 1992

[54] SYSTEM FOR TESTING HIGH-SPEED DIGITAL CIRCUITS

[75] Inventor: Thomas Dance, Sharon, Conn.

[73] Assignee: International Business Machines Corporation, Armonk, N.Y.

[21] Appl. No.: 705,465

[22] Filed: May 24, 1991

[51] Int. Cl.$^5$ ................ G01R 31/28; G06F 11/00
[52] U.S. Cl. ................ 324/158 R; 371/15.1; 371/25.1
[58] Field of Search .......... 324/158 R, 73.1, 158 F; 371/15.1, 16.1, 25.1, 22.6, 22.1, 24, 21.6, 27

[56] References Cited

U.S. PATENT DOCUMENTS

| | | | |
|---|---|---|---|
| 4,354,268 | 10/1982 | Michel et al. | 371/15.1 |
| 4,694,242 | 9/1987 | Peterson et al. | 324/158 R |
| 4,709,366 | 11/1987 | Scott et al. | 371/22.6 |
| 4,931,723 | 6/1990 | Jeffrey et al. | 371/25 |
| 4,998,250 | 3/1991 | Kohlmeier et al. | 371/22.6 |

OTHER PUBLICATIONS

Davis et al., "Signature Analysis Functional Tester", Feb. 1983, IBM Technical Disclosure Bulletin, vol. 25, No. 9, pp. 4658–4661.
Chasteen et al., "Functional Acceptance Card Tester", Oct. 1984, IBM Technical Disclosure Bulletin, vol. 27, No. 5, pp. 3124–3125.
Prais, "General-Purpose Low-End Parallel Bus Interface Circuit Test Fixture", Apr. 1987, IBM Technical Disclosure Bulletin, vol. 29, No. 11, pp. 5023–5027.
Izquierdo et al., "Computer Diagnostic Control Circuitry", Dec. 1988, IBM Technical Disclosure Bulletin, vol. 31, No. 7, pp. 276–279.
Falcoz, "Measurement of I/O Signal Levels in a Multi-Technology Large-Scale Integrated Machine", Jun. 1981, IBM Technical Disclosure Bulletin, vol. 24, No. 1B, pp. 509–510.
Fenton et al., "Multiple-Line Signature Analysis of Asynchronous Logic", May 1984, IBM Technical Disclosure Bulletin, vol. 26, No. 12, pp. 6361–6363.

Primary Examiner—Vinh Nguyen
Attorney, Agent, or Firm—Michael J. Sheer; William A. Kinnaman; Laurence J. Marhoefer

[57] ABSTRACT

A low-cost test system for testing digital circuit elements, such as a memory array, which includes a base to provide operating voltage and an operator interface in combination with interchangeable, removable test modules. Each test module includes a test function data processor, an address generator for selecting addresses to be tested, and a comparator for comparing actual output signals with the generated expected outputs. The test function data processor has a number of stages of high-speed memory and logic to generate independently test program data, test program expected data and test address control data.

2 Claims, 3 Drawing Sheets

SYSTEM FOR TESTING HIGH-SPEED DIGITAL CIRCUITS

BACKGROUND OF THE INVENTION

1. Field of the Invention

The present invention generally relates to an improved system and apparatus for production testing the operation of digital circuits, for example, a digital memory array. More particularly, it relates to a high-speed, low-cost, physically compact apparatus.

2. Description of the Related Art

There are a very large number of systems known in the prior art for production testing digital circuits. In general, high-speed testers for memory arrays and the like tend to be complex and costly.

SUMMARY OF THE INVENTION

Objects of this invention relate to the provision of a system for production testing digital circuits; a system that operates at high speed, is relatively inexpensive, is compact in physical size, is easy to operate, and can be used to test various different circuit systems.

Another object of this invention is the provision of a test system with an architecture for high-speed test signal generation from stored data and timing programs that can be used any number of times, and in any combination, without being restored in memory. This results in a much larger test database than memory size suggests.

A still further object of the invention is the provision of a test system in which portable test modules particularized for a specific circuit or system perform all test functions and a base provides operating voltages to the tested subsystem and an operator interface to the test.

Briefly, this invention contemplates the provision of a low-cost test system for testing digital circuit elements, such as a memory array, which includes a base to provide operating voltage and an operator interface in combination with interchangeable, removable test modules. Each test module includes a test function data processor, an address generator for selecting addresses to be tested, and a comparator for comparing actual output signals with the generated expected outputs. The test function data processor has a number of stages of high-speed memory and logic to generate independently test program data, test program expected data and test address control data.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF THE PREFERRED EMBODIMENT

Figure 2:
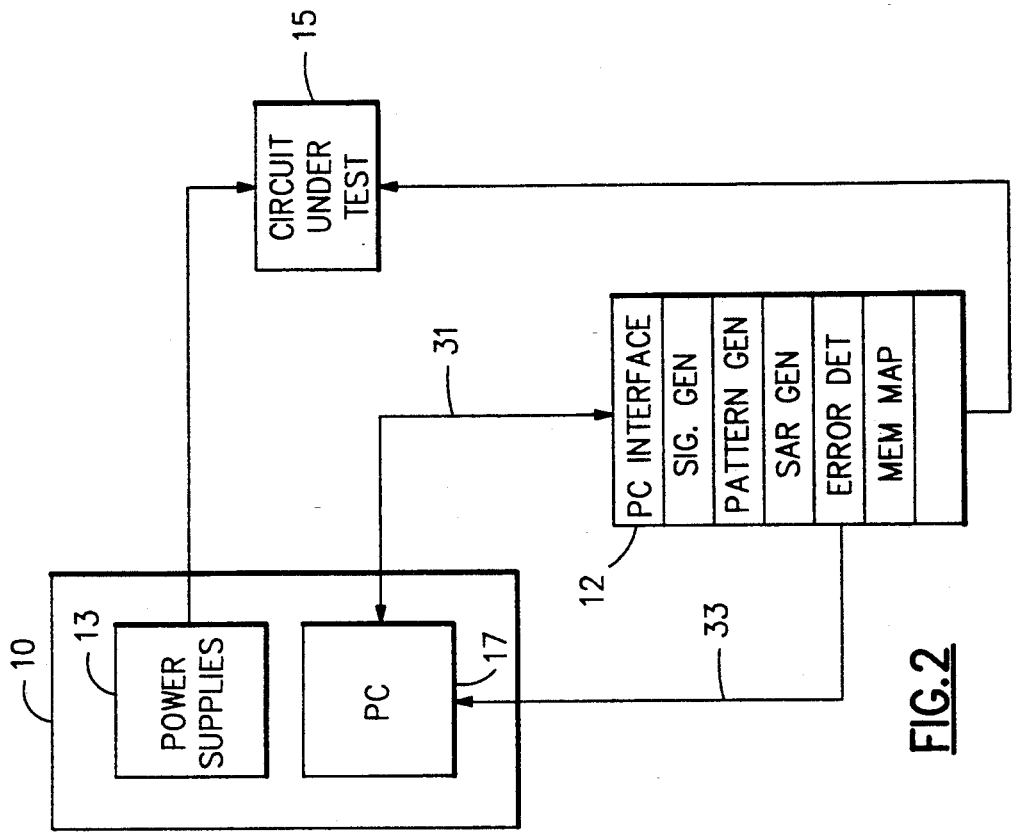
FIG. 2 is a block diagram of the system shown pictorially in FIG. 1.
Figure 1:
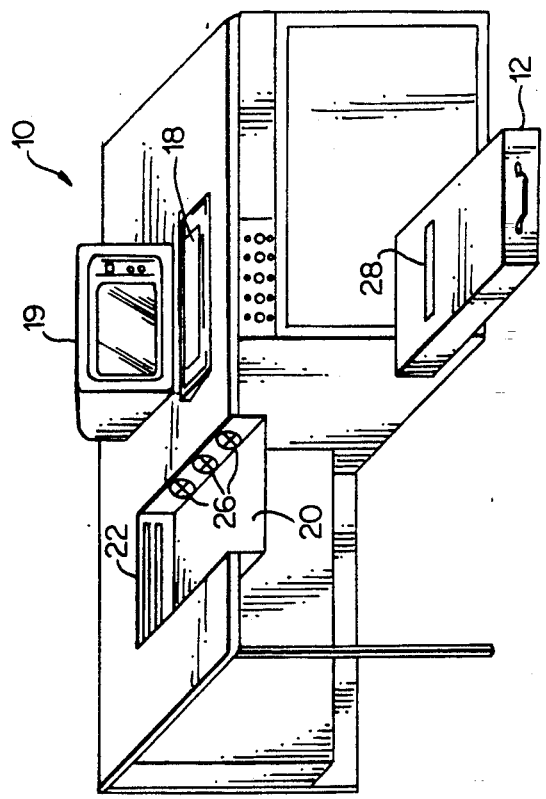
FIG. 1 is a perspective, pictorial view of a test system in accordance with the teachings of this invention.

Referring now to FIGS. 1 and 2, the complete test system comprises a plurality of removable modules 12 and a base unit (hereinafter referred to simply as a "base") indicated by the general reference numeral 10. The base 10 provides a number of power supply voltages from supply a 13 suitable for any of a number of different circuits under test 15. The base includes a personal computer (PC) 17 including a keyboard 18 and a monitor 19 PC 17 functions as an operator console for entering test parameters and observing test results.

The module 12 is the actual tester and includes all of the necessary test electronics. In the exemplary embodiment of the invention, it has six logic cards and runs a test independently of the base 10. The PC 17 in the base 10 communicates with the module 12 and loads it with test parameters. Each module 12 is basically the same in terms of hardware and software but modified for a particular product to be tested. As such, each module 12 is dedicated to a particular circuit under test 15. A base 10 may support several interchangeable modules 12, one for each particular circuit under test.

The base 10 contains AC power, tester power, circuit under test power, fans, and an operator control panel; it contains all but the tester electronics. Housed in the side of the base cabinet are the power supplies, distribution box, PC 17, and the control panel. A frame 20 serves as a cradle for the module 12. At the rear of the frame 20 is an adapter plate 22 used to removably couple the module 12 to the base 10. The adapter plate 22 has power and signal connectors which mate with the connectors on the module 12.

On either side of the frame 20 are fans 26, one set for pushing, one set for pulling. With the module 12 inserted, these fans 26 push air through the cooling slots in the module cage. The module 12 is a portable, self-contained unit designed to be customized and dedicated to testing a particular circuit under test. Normally each base 10 serves several modules 12, each module for a different circuit under test 15. As there are no high-speed, critical, or timing lines between the module 12 and the base 10, any module may be used on any base. Communication with the base 10 is via connectors which mate with the base connectors on the adapter plate 22. A product adapter card 48 (FIG. 3) in module 12 couples the circuit under test to the module. Product adapter card 48 carries a socket into which a circuit under test 15 is inserted.

A slot 28 in the top of the module 12 provides access to the circuit under test socket. The base 10 provides operator-generated test parameters which are transferred to the test module 12 over a control line 31. The module 12 manipulates and stores these parameters. Test results including error data are transferred from module 12 to base 10 over line 33.

Each module 12 is intended to be modified for each different circuit under test 15. Modifications include specifying a clock cycle, circuit under test timings, and connector layout. Thus, the module 12 is dedicated to a circuit under test 15. Any special circuitry is contained in the dedicated module 12, and has no detrimental effects on other modules as they are all independent units. This is a contrast to the multipurpose machine in which modifications for one can affect another.

Figure 3:
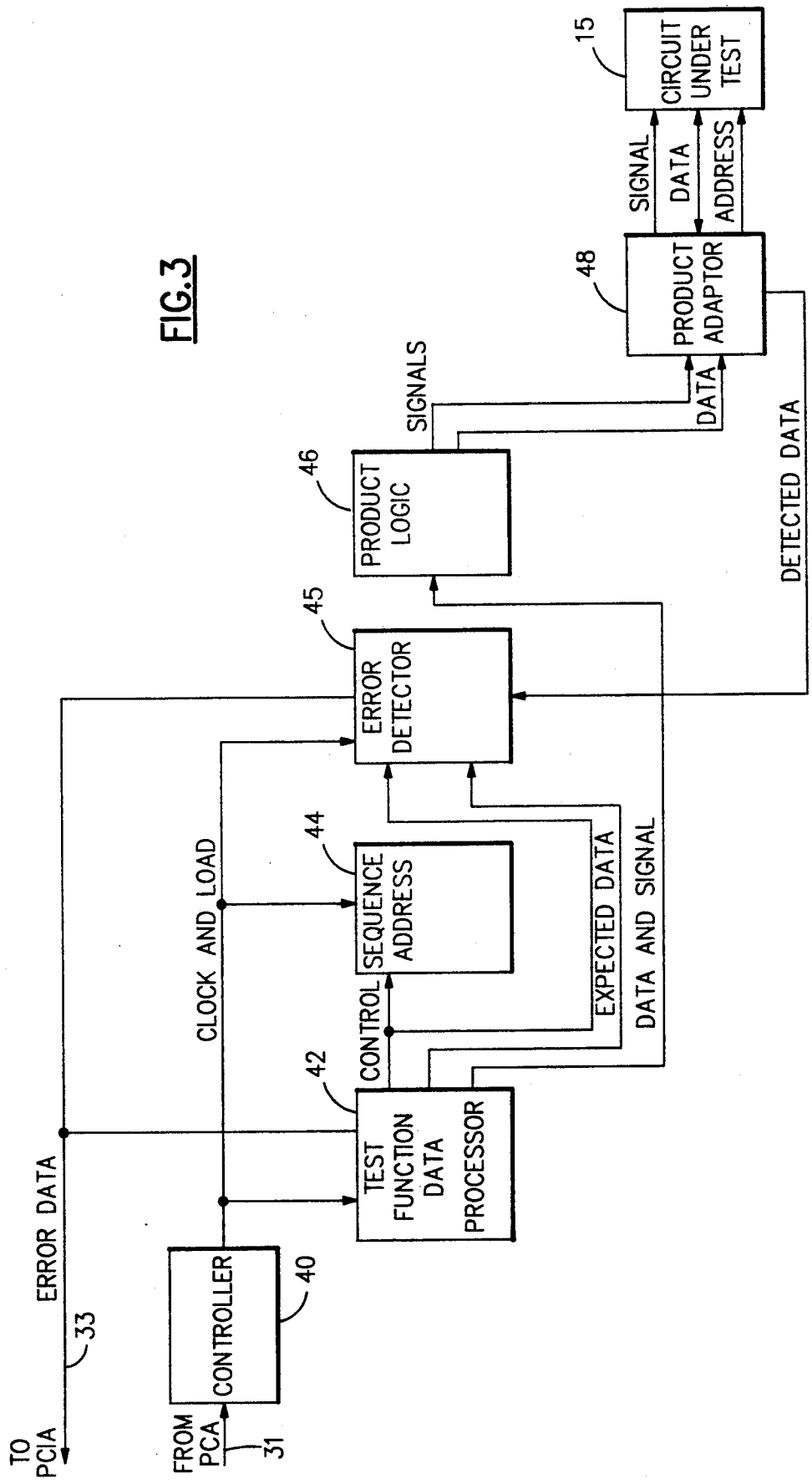
FIG. 3 is a functional block diagram of a test module.

Referring now to FIG. 3, each module 12 has a controller 40 that interfaces with the base PC 17 for loading of test parameters. Test clocks and other control signals originate in controller 40. A test function data processor 42 is the heart of the test module 12. The test function data processor 42 includes ratcheting memories, a microprocessor, signal generators, and data generators as will be explained in more detail in connection with FIG. 4. Test function data processor 42 generates test program data signals for the circuit under test 15, as well as test program expected data signals that are compared with data output signals from the circuit under test.

A sequence address generator 44 provides address generation, multiplexing, and readout functions. The sequence address generator 44 receives control inputs from the test function data processor 42 which provides address sequence information. Test function data processor 42 operates in conjunction with address sequence generator 44 to generate a sequence of addresses for the circuit under test 15. An error detector 45 compares data output signals, generated by the circuit under test 15 in response to the test program data signals generated by test function data processor 42, with the expected data signals generated by the test function data processor. Error detector 45 aligns and checks detected data from the circuit under test 15 for errors and includes error readout and real-time error-logging circuitry. A product logic module 46 adjusts and aligns signals to a specific circuit under test 15. All signals from the test function data processor 42 are coupled to the product logic module 46 for adjustment prior to being transmitted to the circuit under test. This product logic module can be modified by a user. Product adapter card 48 interfaces the signals to the circuit under test 15. It receives the signals from the product logic module 46 and converts them to circuit level signals. A special socket resides on the adapter card 48 into which the circuit under test 15 is plugged. This is accessible from the top of the module cage. All signals are routed to this socket. Data from the circuit under test 15 is transmitted back to the error detector 45.

The base 10 provides menu screens for programming of test parameters. For example, a timing table screen can be used to program the test module control and signal generators for the product under test. An expected data screen can be used to program the data that will be sent to the error detector 45 to be compared with the data out of the product.

A mode screen can be used to put together the test building blocks. For example, a test operator selects one of each of the following categories to define the mode. For example, he or she selects 1 of 256 timing tables; 1 of 256 data-in patterns; 1 of 256 expected data patterns, 1 of 256 start addresses, and 1 of 256 loop counts. The same timing data and patterns, etc. may be used for any number of test modes without using any additional space in memory. Their selection can be mixed and matched for maximum efficiency.

Figure 4:
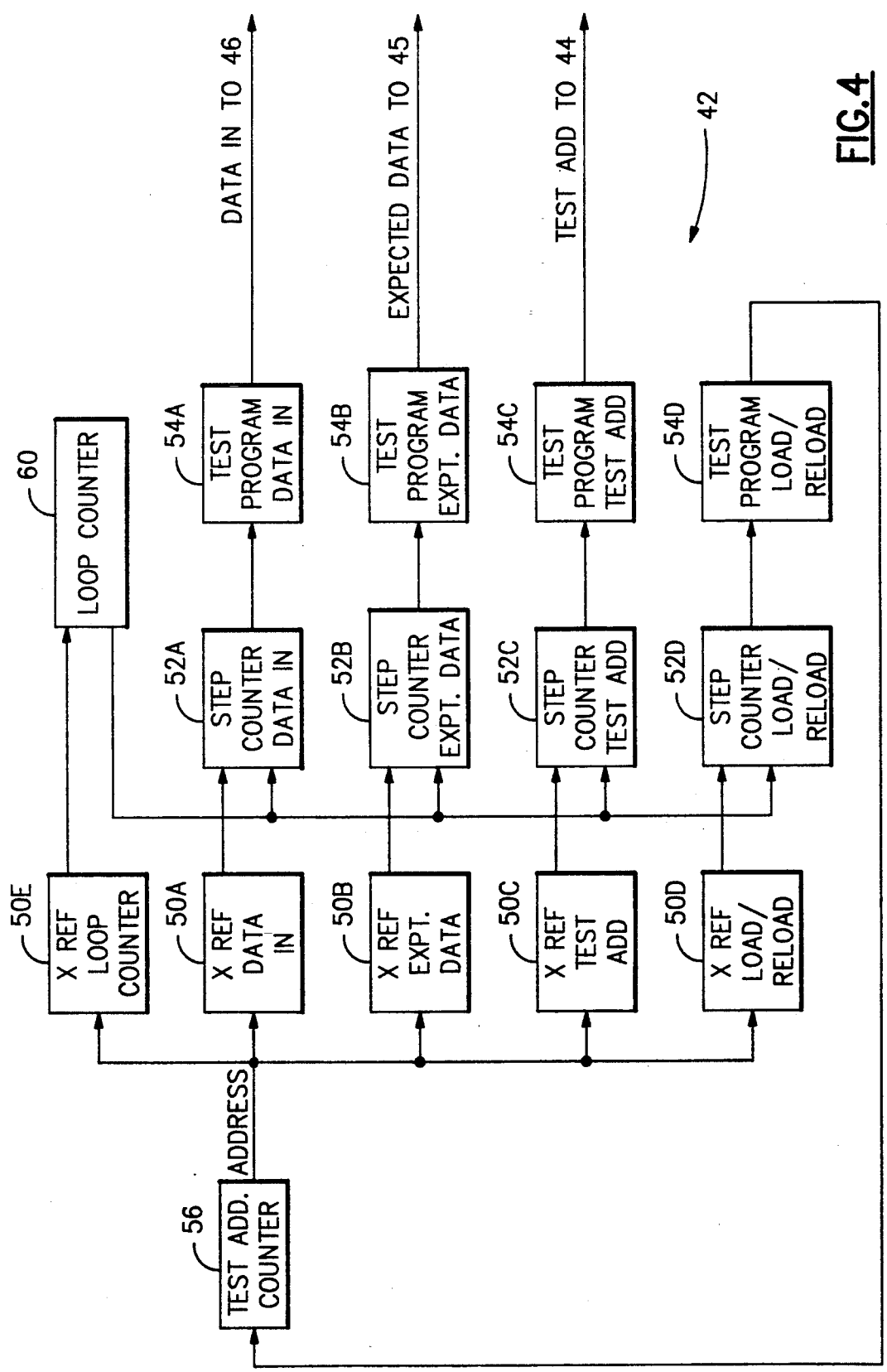
FIG. 4 is a functional block diagram illustrating the architecture of the test data processor function of the test module.

Referring now to FIG. 4, it shows in more detail the architecture of the test function data processor 42, which generates data for the functions of data-in, expected data, and a test address. Each function operates independently, but in synchronization with the operation of the others. Each of the functions data-in, expected data, and test address has a cross-reference memory 50, a step-thru test counter 52, and an independently addressable test program memory 54. The components are labeled A, B, and C respectively for the functions of data-in, expected data, and test address. All are controlled by a test address counter 56. Data-in cross-reference memory 50A, step-thru test counter 52A and test program counter 54A generate test program data signals for the circuit under test 15. Expected data cross-reference memory 50B, step-thru test counter 52B and test program counter 54B generate expected data signals that are compared with data output signals from the circuit under test 15. Test address cross-reference memory 50C, step-thru test counter 52C and test program counter 54C operate in conjunction with sequence address generator 44 to generate a sequence of addresses for the circuit under test 15.

The test address counter 56 sends a common address to the cross-reference memories 50 for all functions. The cross-reference memories 50 each select a starting address for their functions. This address is loaded into their respective step-thru test counters 52 and the output of the step-thru test counters 52 go to their respective test program memories 54. Actual data or programs are stored in the test program memories 54. These programs may comprise, for example, a data instruction sequence to read data from a circuit product under test or write data to the circuit under test.

In effect, each step-thru test counter 52 gives a start address of the program steps for a test program memory 54. A (LOAD/RELOAD) function comprised of memory 50D, counter 52D and program memory 54D generates a flag that signals the end of the program. When this flag comes up, all functions are updated and continue operation on a new program. The test address counter 56 is advanced to a new address, and the cross-reference memories 50 provide new starting addresses. The step-thru test counters 52 are loaded with that new starting address and start stepping their test program memories 54 thru the new program. The running programs which control a function (such as data in) are contained in the test program memories 54. The start of the program is established by the cross reference address, and the end of the program is established (X cycles or addresses away) by the load/reload program.

Each of the functions simultaneously executes its own program, controlled by the test address counter 56 and load/reload which moves it on to the next program.

A mode is a basic unit of test (e.g., scan in 100 bits). A loop is one execution of a mode. A test is a collection of modes all executing one after another.

In operation, the tester is first loaded from the base 10. The test address counter 56 outputs the first test address to all of the process function cross-reference memories 50. At each processor, this address points to the proper program starting address for the function in the respective memories 50. The cross-reference memory outputs are latched and sent to step-thru test counters 52 where they are loaded and clocked. The output of the step-thru test counters 52 are the actual addresses sent to the test program memories 54. These memories contain the data sent to the circuit under test 15. As the step-thru test counter 56 steps through its programmed routine for the mode, alll functions have their own program memories so they can all be executing different programs. All functions are operating independently under the umbrella of the mode and a single common clock (not shown).

A mode is terminated by a LOAD/RELOAD command. It steps the test address counter 56 and loads the step-thru test counters 52 with their new starting addresses. The test is then continued with the first cycle of the new mode following the last cycle of the old; all keyed off the common clock.

More than one execution of a mode can be programmed by a loop counter 60. A loop counter cross-reference memory 50E selects a number indicating the number of times a loop is to be performed for the mode.

When the number of loops has been performed the test will move on to the next mode.

Each cycle of a mode produces one bit of data to the circuit under test. The number of cycles programmed in a mode is determined by the longest function. If for example, the data-in function requires 2,000 cycles and the other functions require something less, the mode would still be programmed at 2,000 cycles. The mode length is programmed simply by programming the load/reload memory 50D.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A system for testing high-speed digital circuits comprising:
   a base unit including an operator console for entering test parameters and observing test results;
   a test module including means for generating a sequence of addresses for a circuit under test, means for generating test program data signals, means for generating test program expected data signals, and means for comparing data output signals generated by said circuit under test in response to said test program data signals with said expected data signals;
   means for coupling a circuit under test to said module;
   means for removably coupling said test module to said base unit;
   means for transferring test parameters from said base unit to a test module coupled to said base unit; and
   means for transferring test results to said base unit from a test module coupled to said base unit.

2. A system for testing high-speed digital circuits, comprising in combination:
   a base unit including an operator console for entering test parameters and observing test results;
   a test module including means for generating a sequence of addresses for a circuit under test, means for generating test program data signals, means for generating test program expected data signals, and means for comparing data output signals generated by said circuit under test in response to said test program data signals with said expected data signals;
   said means for generating a sequence of addresses, said means for generating test program data signals, and said means for generating test program expected data signals each including an independently addressable memory for programming its sequential operation;
   means for providing a single starting address for said means for generating a sequence of addresses, said means for generating test program data signals, and said means for generating test program expected data signals;
   means for coupling a circuit under test to said module;
   means for removably coupling said test module to said base unit;
   means for transferring test parameters from said base unit to a test module coupled to said base unit; and
   means for transferring test results to said base unit from a test module coupled to said base unit.

* * * * *